(12) United States Patent
Anderson et al.

(10) Patent No.: US 11,408,913 B2
(45) Date of Patent: Aug. 9, 2022

(54) METHOD FOR TESTING SEMICONDUCTOR DEVICES

(71) Applicant: TEXAS INSTRUMENTS INCORPORATED, Dallas, TX (US)

(72) Inventors: Dale Lee Anderson, Los Gatos, CA (US); Artur Darbinyan, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 589 days.

(21) Appl. No.: 16/149,980

(22) Filed: Oct. 2, 2018

(65) Prior Publication Data

US 2019/0120874 A1 Apr. 25, 2019

Related U.S. Application Data

(62) Division of application No. 14/527,972, filed on Oct. 30, 2014, now Pat. No. 10,101,361.

(60) Provisional application No. 61/903,681, filed on Nov. 13, 2013, provisional application No. 61/903,672, filed on Nov. 13, 2013.

(51) Int. Cl.
*G01R 31/28* (2006.01)
*G01R 1/04* (2006.01)

(52) U.S. Cl.
CPC ......... *G01R 1/0466* (2013.01); *G01R 1/0483* (2013.01); *G01R 31/2867* (2013.01); *G01R 31/2879* (2013.01)

(58) Field of Classification Search
CPC .............. G01R 1/0466; G01R 1/07314; G01R 31/2879; G01R 31/2886; G01R 31/2889; G01R 31/2896
See application file for complete search history.

(56) References Cited

U.S. PATENT DOCUMENTS

| 5,237,268 A | 8/1993 | Honma et al. |
| 6,072,326 A | 6/2000 | Akram et al. |
| 6,175,241 B1 | 1/2001 | Hembree et al. |
| 6,215,323 B1 | 4/2001 | Rennies et al. |
| 2003/0052319 A1 | 3/2003 | Chen et al. |
| 2006/0014309 A1* | 1/2006 | Sachdev ............ G01R 1/0466 438/17 |
| 2013/0181733 A1* | 7/2013 | Kikuchi ............ G01R 31/2893 324/750.03 |
| 2015/0276801 A1* | 10/2015 | Yamada ............ G01R 31/2893 324/750.25 |

OTHER PUBLICATIONS

Dale Lee Anderson, et al., "Assembly for Testing Semiconductor Devices", U.S. Appl. No.14/527,938, filed Oct. 30, 2014, 35 pages.

* cited by examiner

*Primary Examiner* — Tung X Nguyen
(74) *Attorney, Agent, or Firm* — Ronald O. Neerings; Charles A. Brill; Frank D. Cimino

(57) ABSTRACT

A method of testing semiconductor devices includes placing a plurality of semiconductor devices in a carrier assembly and performing at least one testing operation on the plurality of semiconductor devices while they remain inside the carrier assembly.

21 Claims, 20 Drawing Sheets

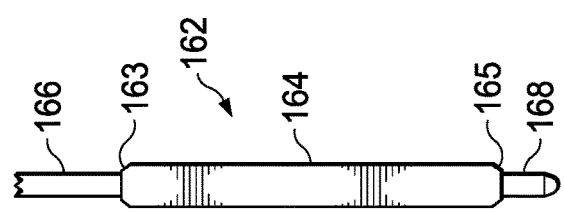
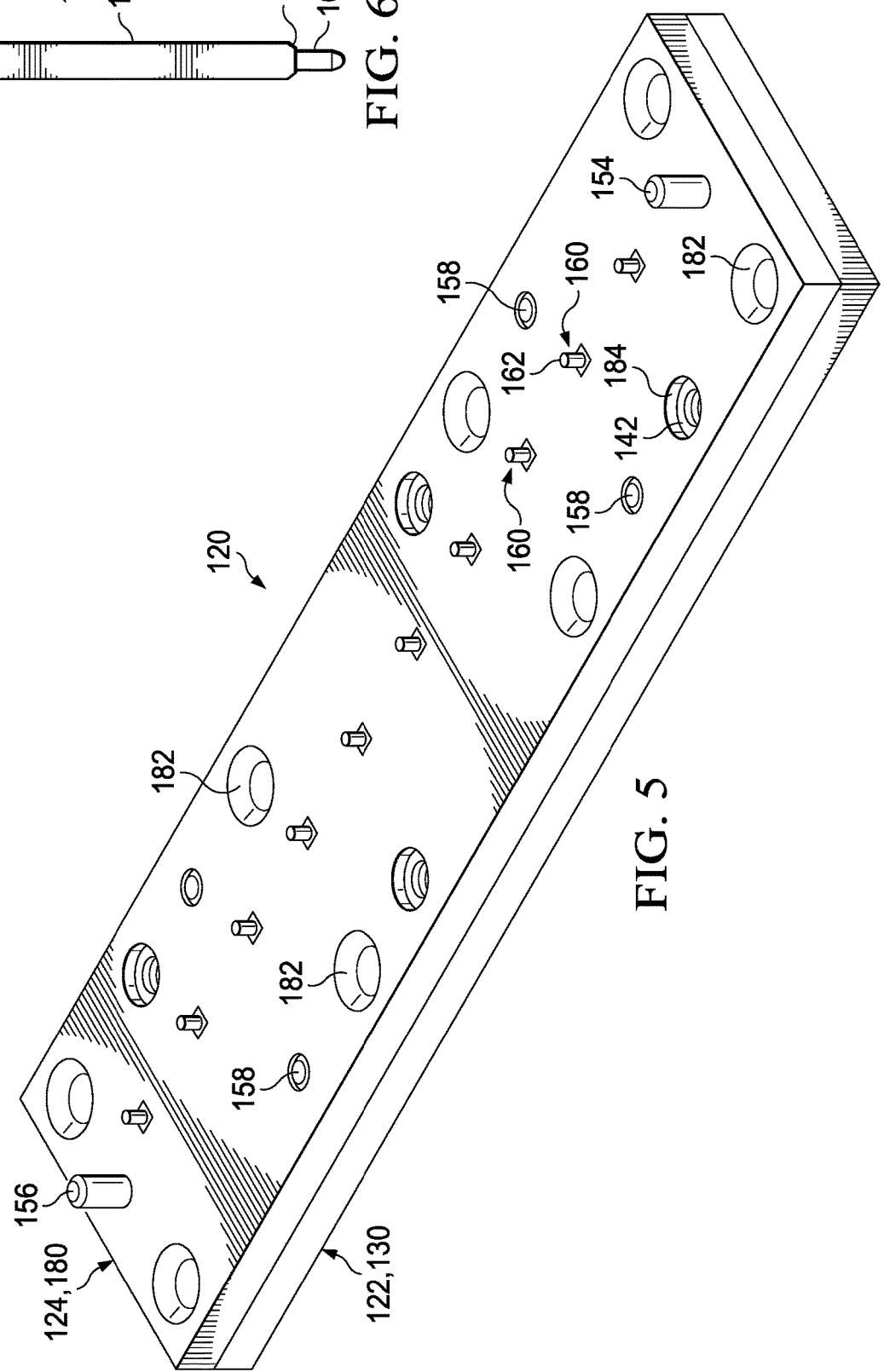

METHOD FOR TESTING SEMICONDUCTOR DEVICES

This application is a Divisional of application Ser. No. 14/527,972 filed Oct. 30, 2014 which claims priority of U.S. Provisional Application No. 61/903,672 filed Nov. 13, 2013, and of U.S. Provisional Application No. 61/903,681, which are both hereby incorporated by reference for all that is disclosed therein. U.S. Non-provisional Patent Application for ASSEMBLY FOR TESTING SEMICONDUCTOR DEVICES, of Anderson, et al., Ser. No. 14/527,938, filed Nov. 13, 2014, now abandoned, is hereby incorporated by reference for all that it discloses.

BACKGROUND

Device qualification for DSBGA (Die-Sized Ball Grid Array), WCSP (Wafer Chip Scale Package), QFN (Quad Flat No lead) and other semiconductor devices involves electrical and reliability testing of a predetermined number of prototype devices that have been produced at a particular facility. There are number of occasions during device qualification in which physical handling of a device occurs. For example, loading of a semiconductor device (sometimes referred to herein as a "DUT," "device under test," or simply "device") into various test equipment, such as ATE (automatic test equipment) biased reliability test equipment, such as B-HAST (Biased Highly Accelerated Stress Test), Autoclave, etc., and removing the device from such equipment all require handling of the device. However, handling of a device may cause catastrophic damage, chipping or loss of the device (especially with small and extremely small die sizes). Handling may thus cause qualification failures that are not related to the quality of the device.

A number of reliability tests require stressing of a device under bias. The current technique for doing this involves mounting the device (typically by soldering) on a conversion printed circuit board (PCB). The device mounting process includes a number of cleaning and processing steps, which have inherent risk of damaging the device before the bias reliability test is even conducted. If the device fails any of the bias reliability tests, separate failure analysis testing of the device must be performed. In the event of bias reliability test failure, the device must be removed from the PCB and cleaned to remove solder flux before failure analysis on the device is conducted. These process steps required after reliability test failures, introduce further opportunities for handling-related device failures.

In addition to the risk of handling-related failures there are other problems inherent in current device qualification procedures. Variations in the printed circuit boards on which devices are mounted for testing introduce a separate set of variables. These variables include: the type of board material that is used; design variations between boards; the type of flux used to attach a device to a conversion board; and variations in the cleaning process used for flux removal.

SUMMARY

One example method of testing semiconductor devices described herein includes placing a plurality of semiconductor devices in a carrier assembly and performing at least one testing operation on the plurality of semiconductor devices while they remain inside the carrier.

Another example method of testing semiconductor devices described herein includes placing a plurality of loose semiconductor devices in a carrier assembly. The method also includes preconditioning the semiconductor devices in the carrier assembly and performing at least one pre-stress electrical test on the semiconductor devices in the carrier assembly. The method further includes performing at least one bias-stress test on the semiconductor devices in the carrier assembly and performing at least one post-stress electrical test on the semiconductor devices in the carrier assembly.

A further example method of testing semiconductor devices described herein includes placing a plurality of semiconductor devices of a first design in a first carrier assembly and mounting the first carrier assembly on a test socket with a first predetermined number of electrical contact surfaces of each of the plurality of semiconductor devices of the first design in contact with corresponding contact surfaces of the test socket and performing at least one testing operation on the plurality of semiconductor devices of the first design while they remain inside the carrier assembly. The method also includes placing a plurality of semiconductor devices of a second design in a second carrier assembly and mounting the second carrier assembly on a test socket with a second predetermined number of electrical contact surfaces of each of the plurality of semiconductor devices of the second design in contact with corresponding contact surfaces of the test socket, wherein the second predetermined number is different than the first predetermined number. The method further includes performing at least one testing operation on the plurality of semiconductor devices of the second design while they remain inside the second carrier assembly.

BRIEF DESCRIPTION OF THE DRAWINGS

FIG. 5 is an isometric view of the socket assembly of FIG. 4 in an assembled state.

FIG. 6 is a side elevation view of a spring pin assembly.

DETAILED DESCRIPTION

Figure 1:
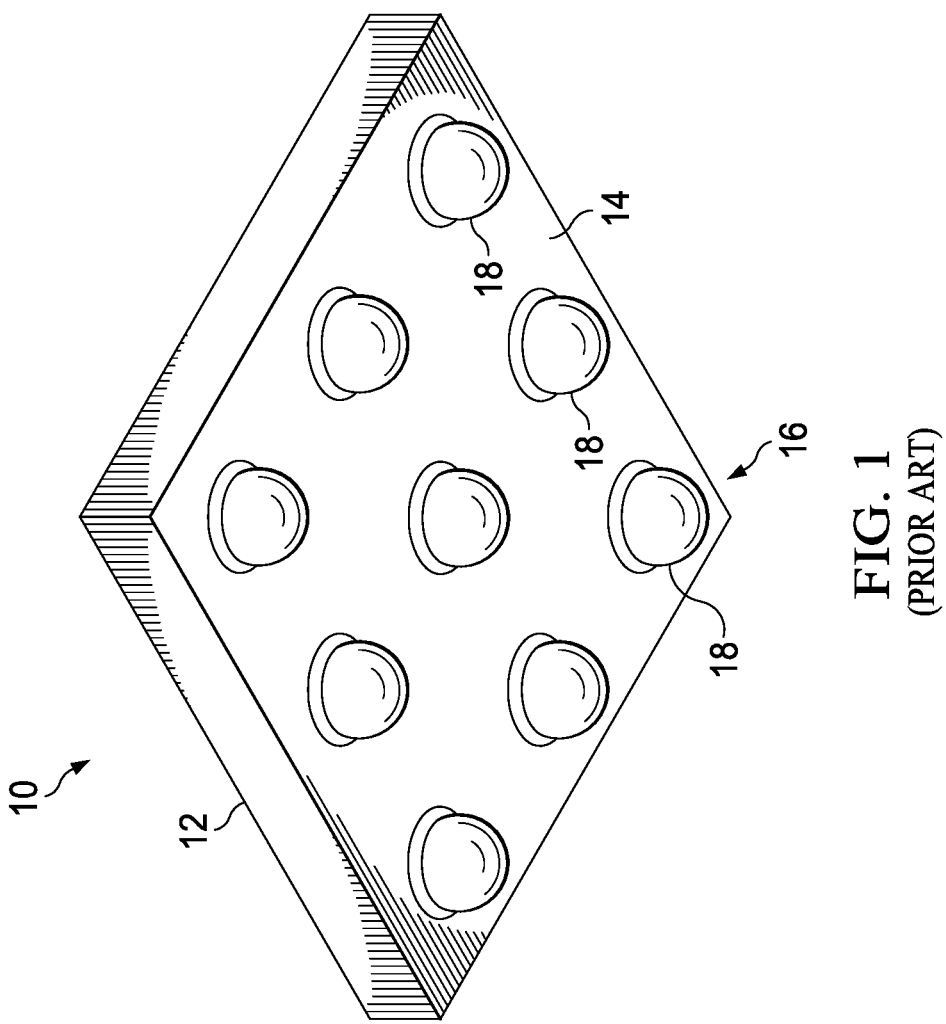
FIG. 1 is a bottom isometric view of a prior art flip chip die.

FIG. 1 is a bottom isometric view of a conventional flip chip die 10. The die 10 has a top face 12 and an active bottom face 14. The bottom face has a solder bump array 16 formed on it. The solder bump array 16 may comprises a 3×3 array with nine individual solder bumps 18. A The carrier assemblies and associated socket assemblies described herein are adapted to test multiple devices such as die 10 in an efficient, convenient, and cost-effective manner that eliminates many of the handling steps of conventional testing procedures.

Figure 2:
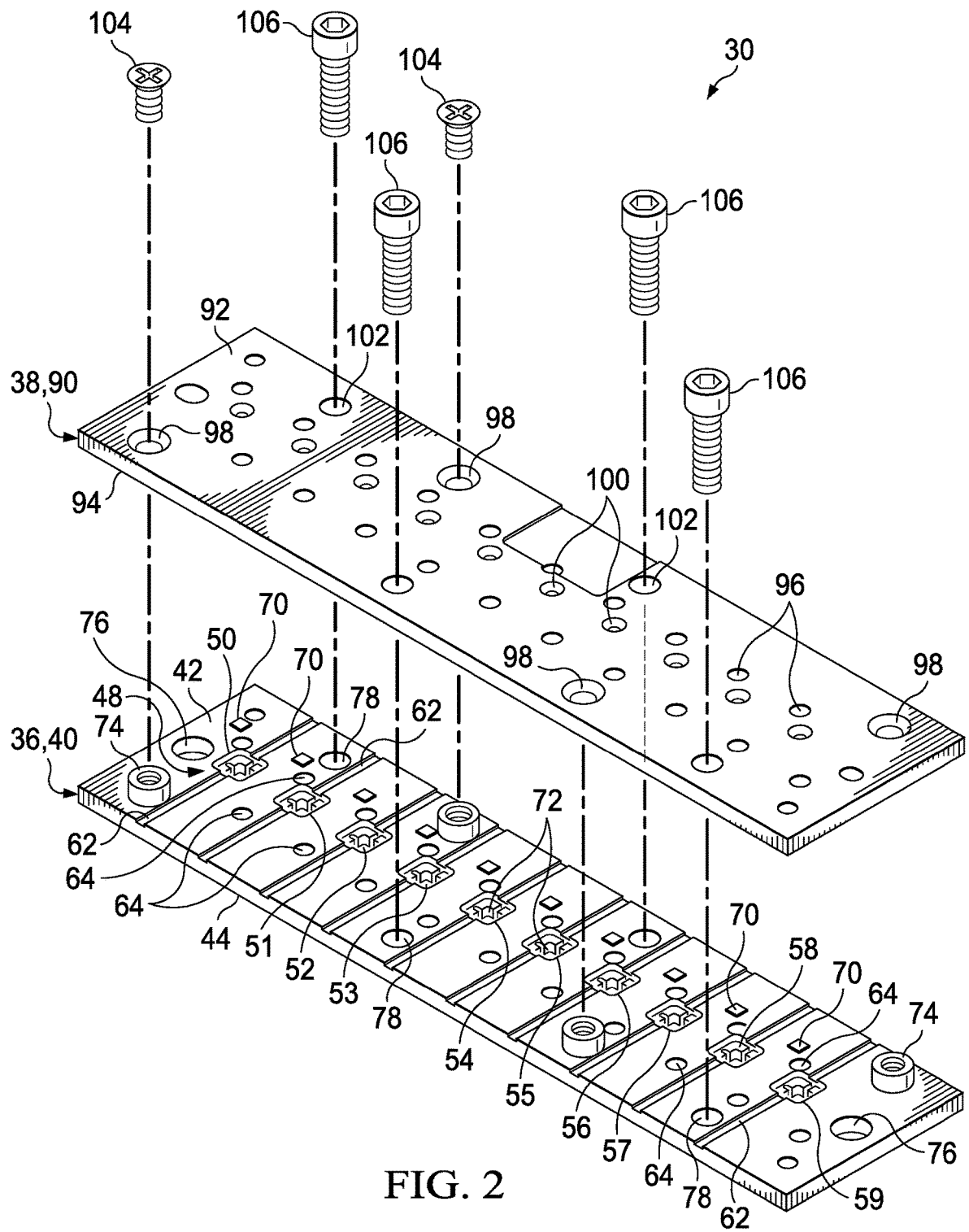
FIG. 2 is an exploded isometric view of a multiple device under test ("DUT") carrier assembly.

FIG. 2 is an exploded isometric view of a multiple device under test ("DUT") carrier assembly 30, which may be referred to herein simply as "carrier assembly 30, or carrier 30." The DUT's, which the carrier assembly 30 is adapted to carry may be conventional flip chip dies, such as die 10, or various other semiconductor devices. The carrier assembly 30 shown in FIG. 2 has a bottom portion 36, which may be a bottom plate 40. The carrier assembly 30 has a top portion 38, which may be a top plate 90. The bottom plate 40 has a top surface 42 and a bottom surface 44. A plurality of pockets 48 are formed on the top surface 42, and may comprise individual pockets 50-59. A laterally extending groove 62 may intersect each of the pockets 48. The grooves 62 are adapted to provide conditioning (temperature, pressure, and humidity) air to the pockets 48. Two ATE socket registration holes 64 are positioned adjacent on opposite sides of each of the pockets 48. The pockets 48 are each adapted to receive and operably support a DUT 70, such as die 10, which in FIG. 2 are shown positioned above associated pockets. A hole 72 is provided at the center of each of the pockets 48. The hole 72 is adapted to receive an end portion of a multiple pin spring pin assembly, as further described below. Four bosses 74 having threaded holes therein extend upwardly from the upper surface 42 of the plate 40 and are located adjacent to edge portions of the plate 40. A hole 76 for receiving a socket alignment pin (not shown) is provided at each end of the plate 40. Four holes 78 extend through the plate to facilitate attachment of the carrier assembly 30 to a socket assembly and test board, as described further below.

Figure 3:
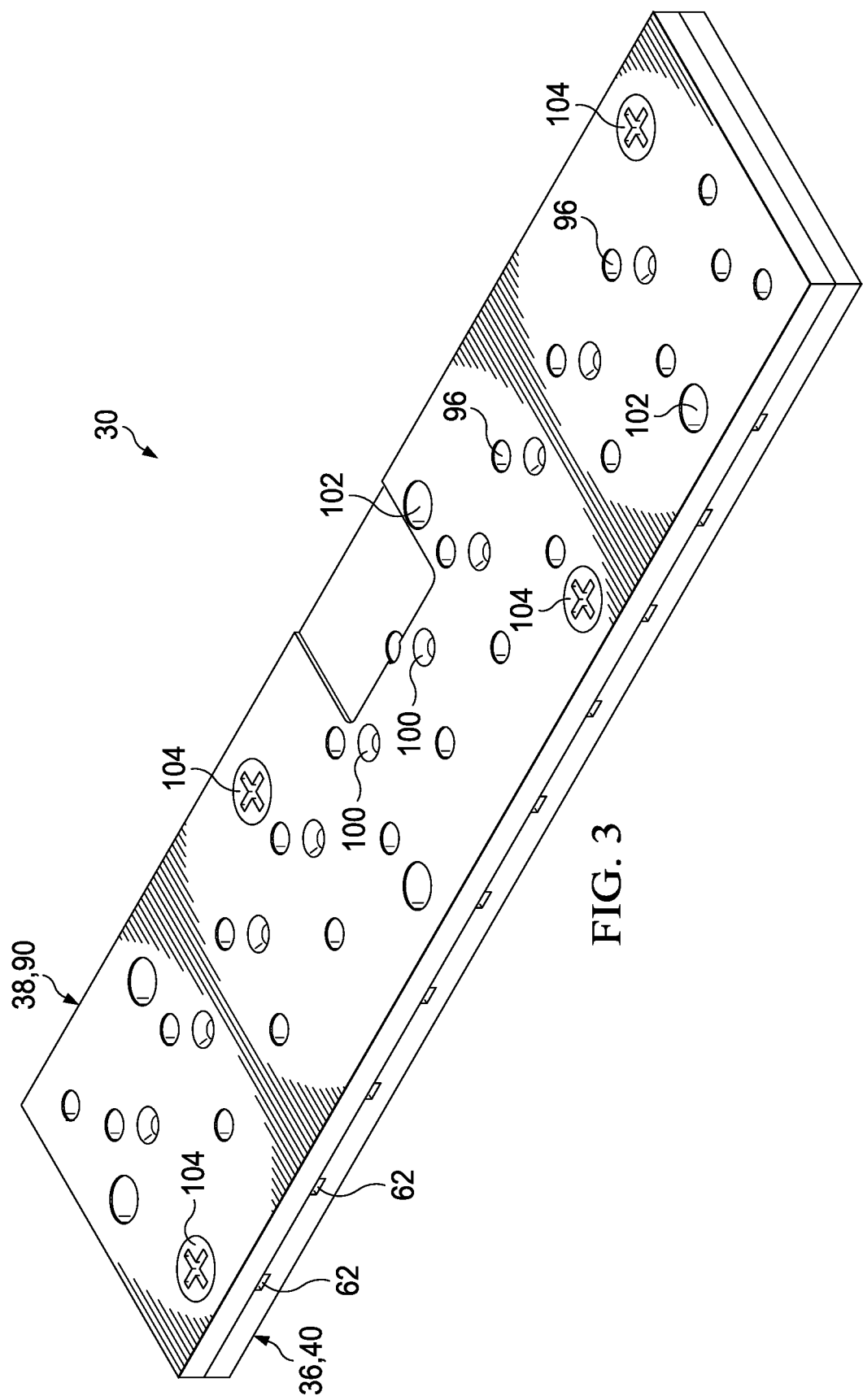
FIG. 3 is an isometric view of the carrier assembly of FIG. 2 in an assembled state.

The top portion 38 of the carrier assembly 30 may comprise a top plate 90 having a top surface 92 and a bottom surface 94. A plurality of ATE registration holes 96 are adapted to be positioned above the ATE registration holes 64 in the bottom plate 30. A plurality of recessed holes 98 are adapted to be aligned with the bosses 74 on the lower plate 40. DUT conditioning holes 100 are arranged to be positioned over corresponding pockets 48 in the lower plate 30. Four holes 102 in plate 90 are adapted to be aligned with holes 78 in the lower plate 30. A plurality of plate attachment screws 104 are received in the recessed holes 98 and associated bosses 74. Four holes 102, which are adapted be aligned with holes 78, receive socket attachment screws 106 therethrough to attach the carrier assembly 30 to a socket assembly, as described in further detail below. FIG. 3 shows the carrier assembly of FIG. 2 in an assembled state.

Figure 4:
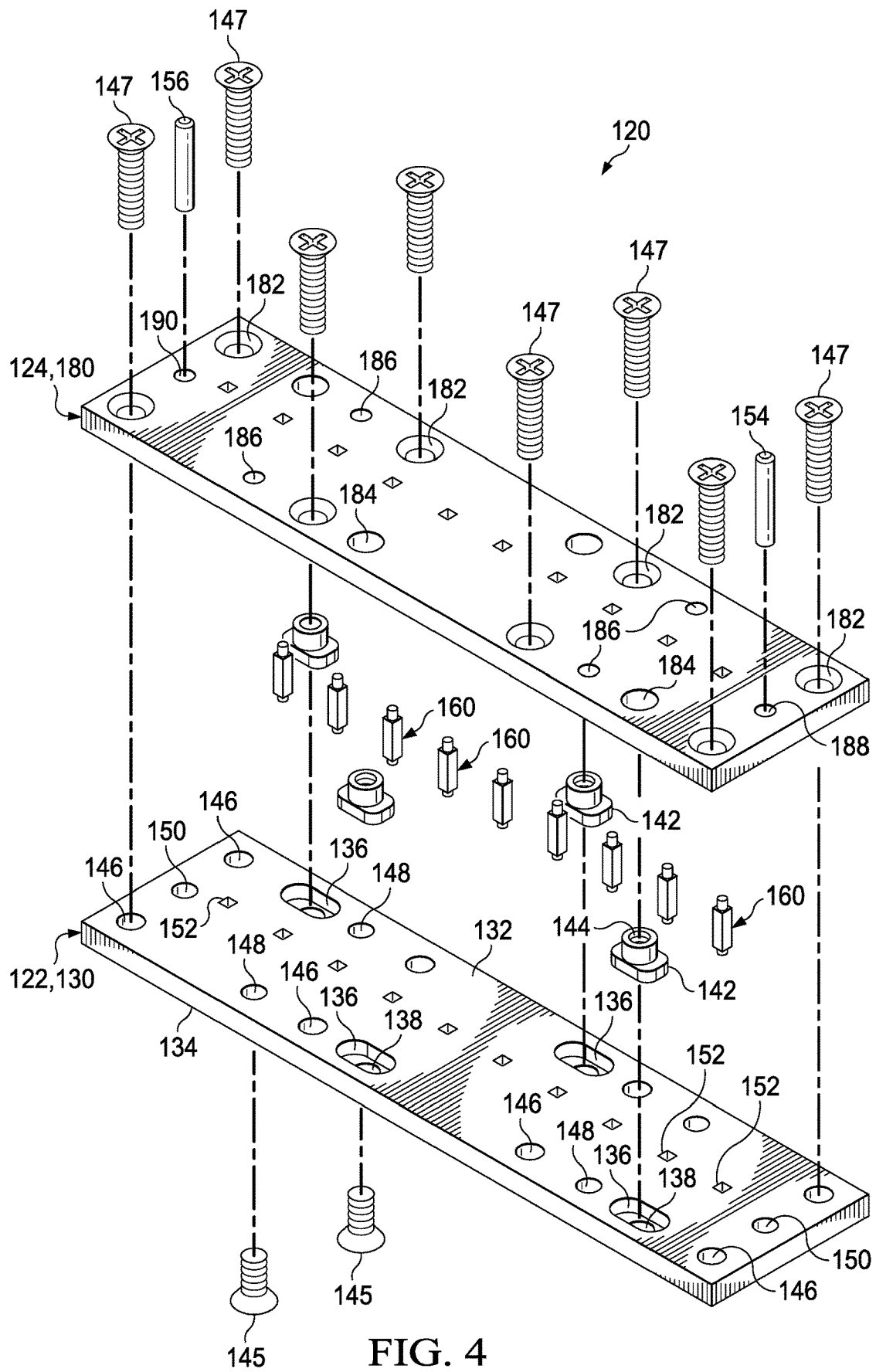
FIG. 4 is an exploded isometric view of a socket assembly.

FIG. 4 is an exploded isometric view of a socket assembly 120 of a type that is adapted to be used with a carrier assembly, such as carrier assembly 30. FIG. 5 is an assembled isometric view of the socket assembly 120 of FIG. 4. The socket assembly 120 has a bottom portion 122 and a top portion 124. The bottom portion 122 may be provided by a bottom plate 130 having a top surface 132 and a bottom surface 134. The bottom plate 130 has a number of recessed slots 136 therein with a hole 138 at the base of each slot 136. Boss members 142 are received in the slots 136 with the hole 144 in the boss member aligned with the hole 138 in the slot. Boss member attachment screws 145 are used to attach the boss members 142 to the plate 130. Threaded holes 146 are adapted to receive screws 147 for attaching the top plate 180 to the bottom plate 130. Alignment pin holes 150 are adapted to receive alignment pins 154, 156. A plurality of seating pin holes 146 are adapted to receive seating pins 158 (shown in FIG. 5 only). A plurality of spring pin holes 152 extends through the bottom plate 130 and are adapted to be positioned in alignment with DUT's mounted in associated carrier assembly 30. The spring pin holes 152 each receive a spring pin assembly 160 therein. In the embodiment of FIGS. 4 and 5, each spring pin assembly 160 has a 3×3 array of individual spring pins 162, FIG. 6. Because of the relatively small size of each individual spring pin 162, the multiple spring pins 162 of each spring pin assembly are not shown in detail in FIG. 4.

FIG. 6 is a side elevation view of an individual spring pin 162. Spring pin 162 has a barrel portion 164 having terminal ends 163 and 165. A top plunger member 166 is received in the barrel portion 164 and extends upwardly from the top end 163 of the barrel portion. The bottom plunger member 168 extends downwardly from the bottom end 165 of the barrel portion 164. Each of the plunger members 166, 168 is attached to an internal spring assembly (not shown). Spring pins as described herein are known in the art and are sometimes referred to as "pogo pins." FIG. 6 illustrates the fully extended position of each of the plunger members 166, 168. Inwardly directed pressure on the ends of plunger members 166 or 168 causes the plunger members to move into retracted positions. In one embodiment, in the retracted position of each of the plunger members 166, 168 the terminal end portion thereof is flush with an associated terminal end 163, 165 of the barrel portion 164.

Returning again to FIGS. 4 and 5, the top plate 180 as eight countersunk holes 182 therein, which are aligned with holes 146 in the bottom plate 130. The countersunk holes 182 receive screws 147 therethrough to attach the top plate 180 to the bottom plate 130. Holes 184 are adapted to be aligned with the boss members 142 mounted on the lower plate. Elongate screws 106, FIG. 2, pass through holes 78, 102 in the carrier assembly 30 and holes 184 in the socket assembly top plate 180 and are thread into the boss members 142. The elongate screws 106 attach the carrier assembly 30 to the socket assembly 120. The top plate 180 also comprises seating pin holes 186 and alignment pin holes 188, 190. The seating pin holes 188 receive small seating pins 158 therein (shown only in FIG. 5) that facilitate alignment and seating of the carrier assembly 30 with the socket assembly 120. Alignment pins 154 and 156 are received in the alignment pin holes 188 and 190, respectively. The alignment pins 154, 156 facilitate alignment of the carrier assembly 30 with the socket assembly 120.

Figure 7:
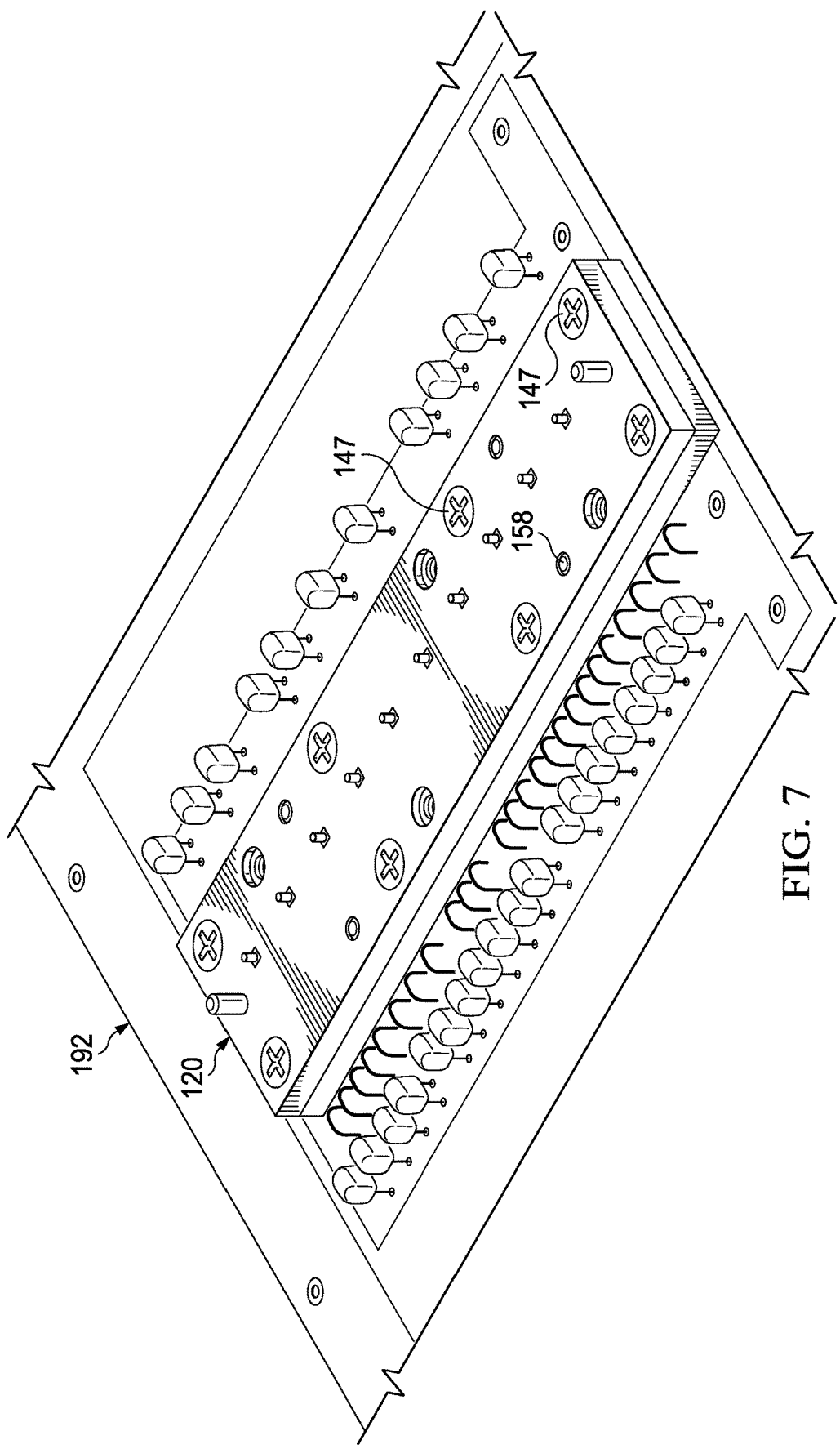
FIG. 7 is a top plan view of the socket assembly a FIG. 5 mounted on a reliability test board.
Figure 8:
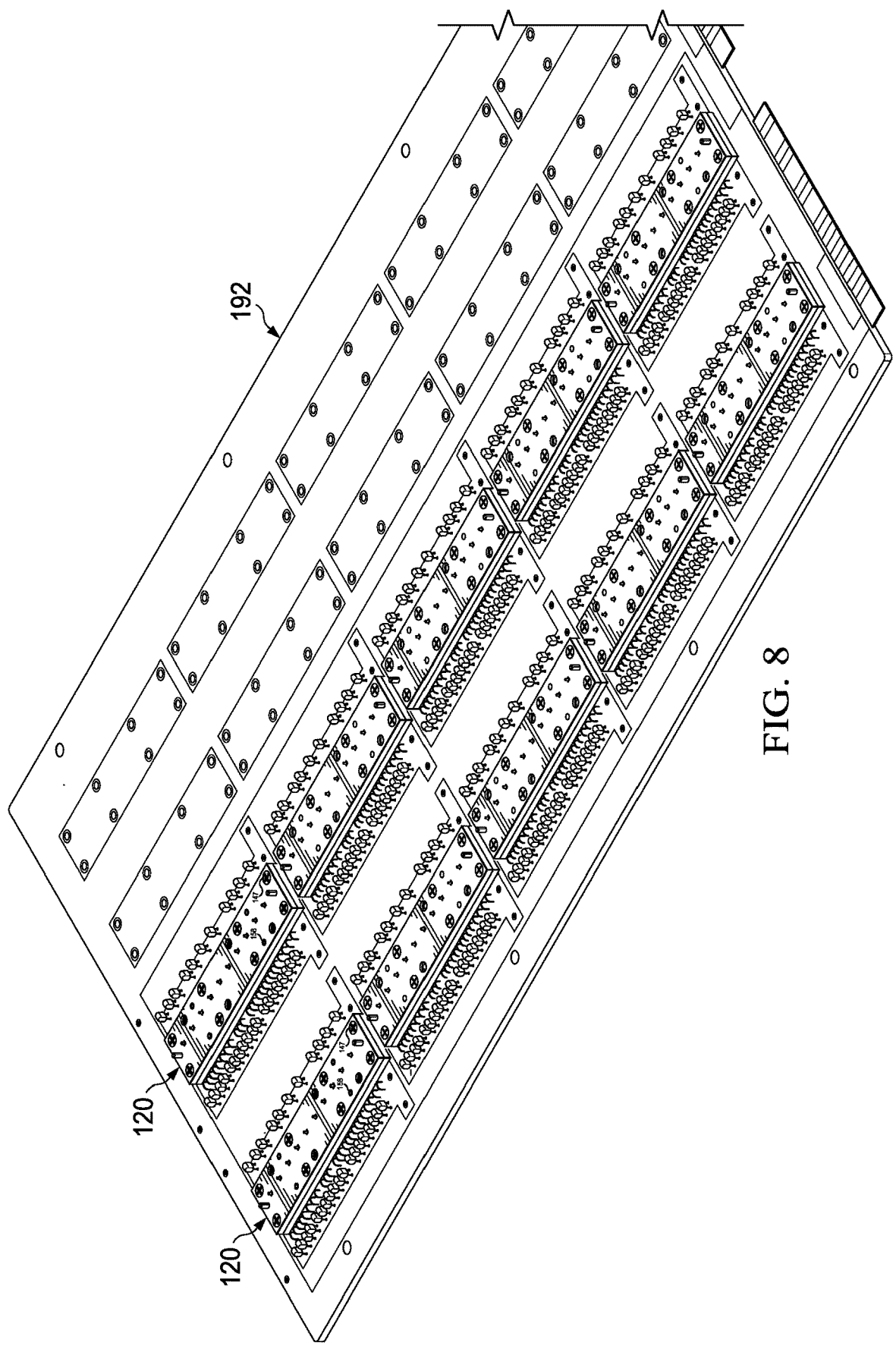
FIG. 8 is a top isometric view of a plurality of socket assemblies mounted on a reliability test board.
Figure 9:
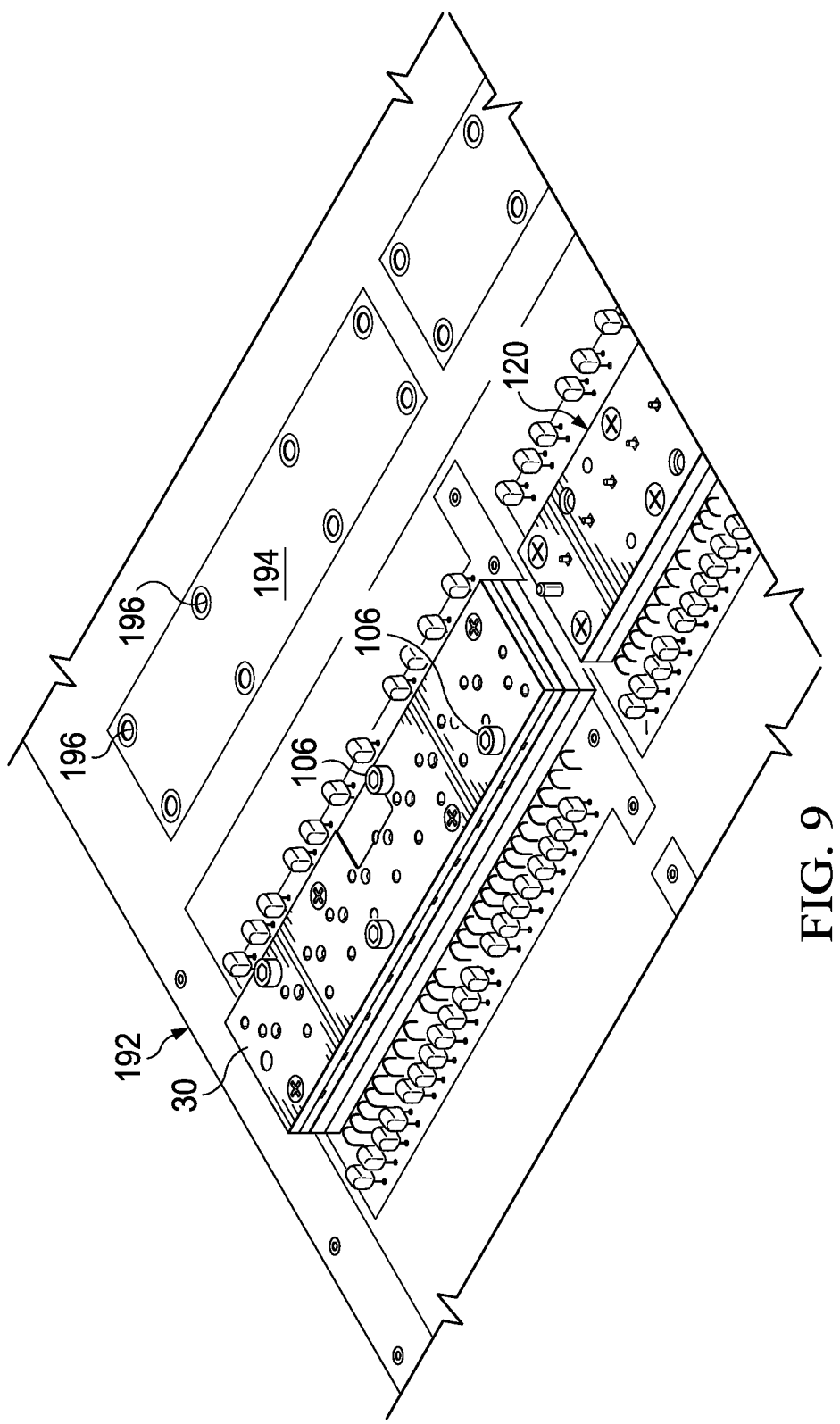
FIG. 9 is a top isometric view of a carrier assembly mounted on a socket assembly that is, in turn, mounted on a reliability test board.
Figure 10:
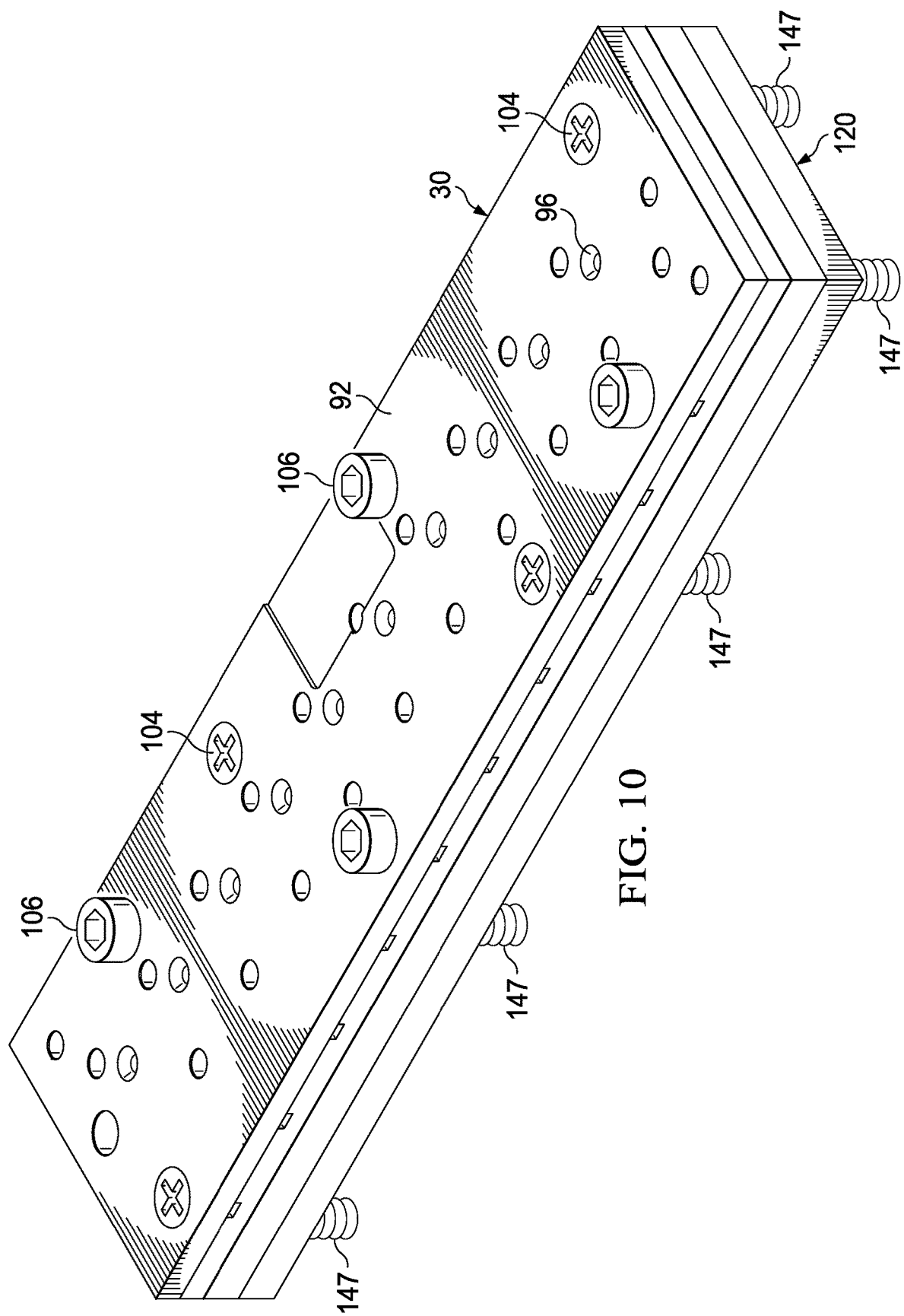
FIG. 10 is an isometric view of a carrier assembly mounted on a socket assembly.

FIGS. 7, 8 and 9 illustrate a reliability test board 192, which in the illustrated embodiment is a bHAST board. The reliability test board 192 has a test socket attachment area 194, FIG. 9. The test socket attachment area 194 has eight holes 196 therein. FIG. 10 illustrates a carrier assembly 30 attached to a test socket 120. Eight attachment pins 147 (only four shown in FIG. 10) extend from the bottom of the test socket 120 and are received in the holes 196 in the board 192 to attach test socket 120 to the reliability test board 192.

Figure 11:
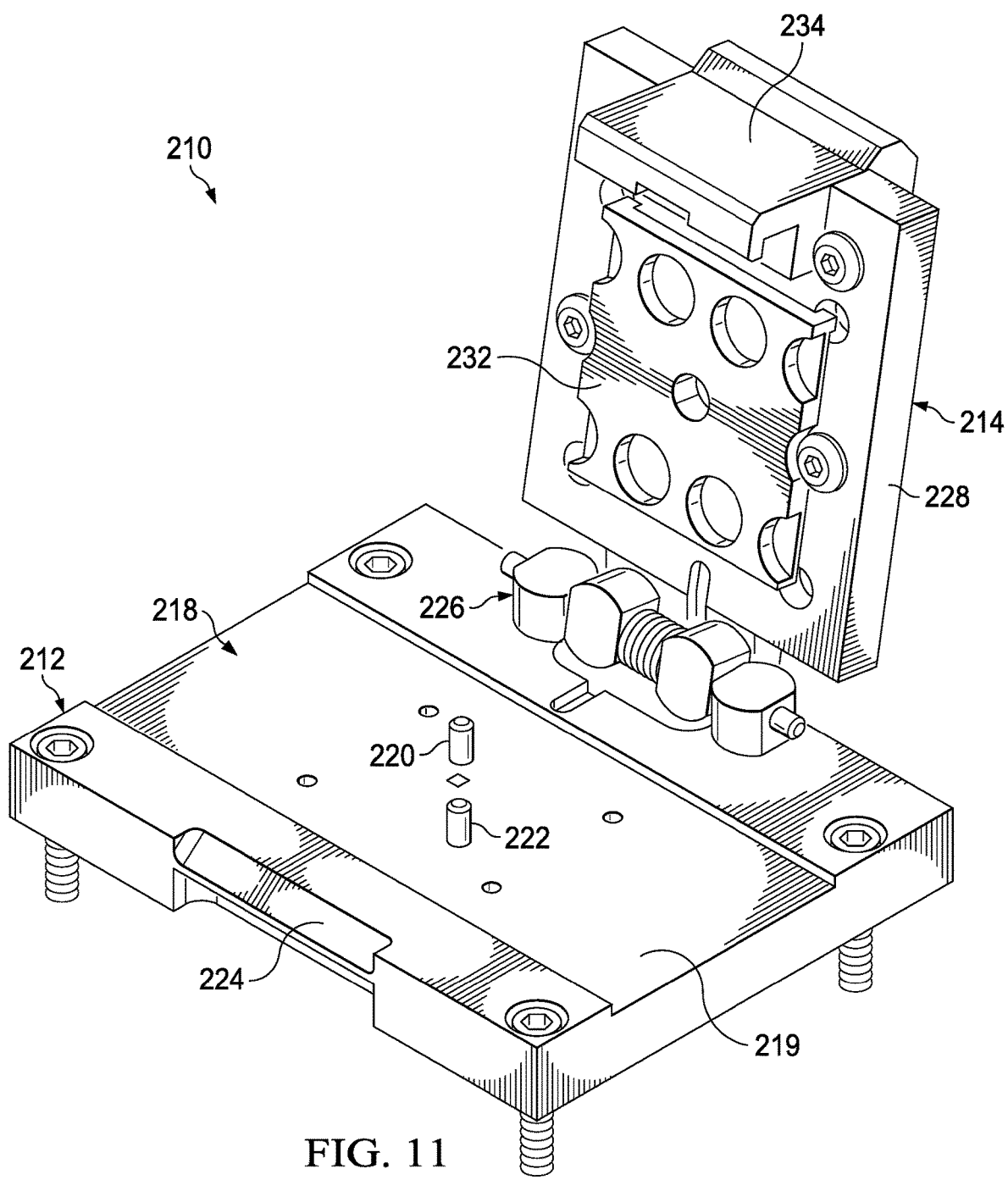
FIG. 11 is an isometric view of an ATE socket in an open state.
Figure 12:
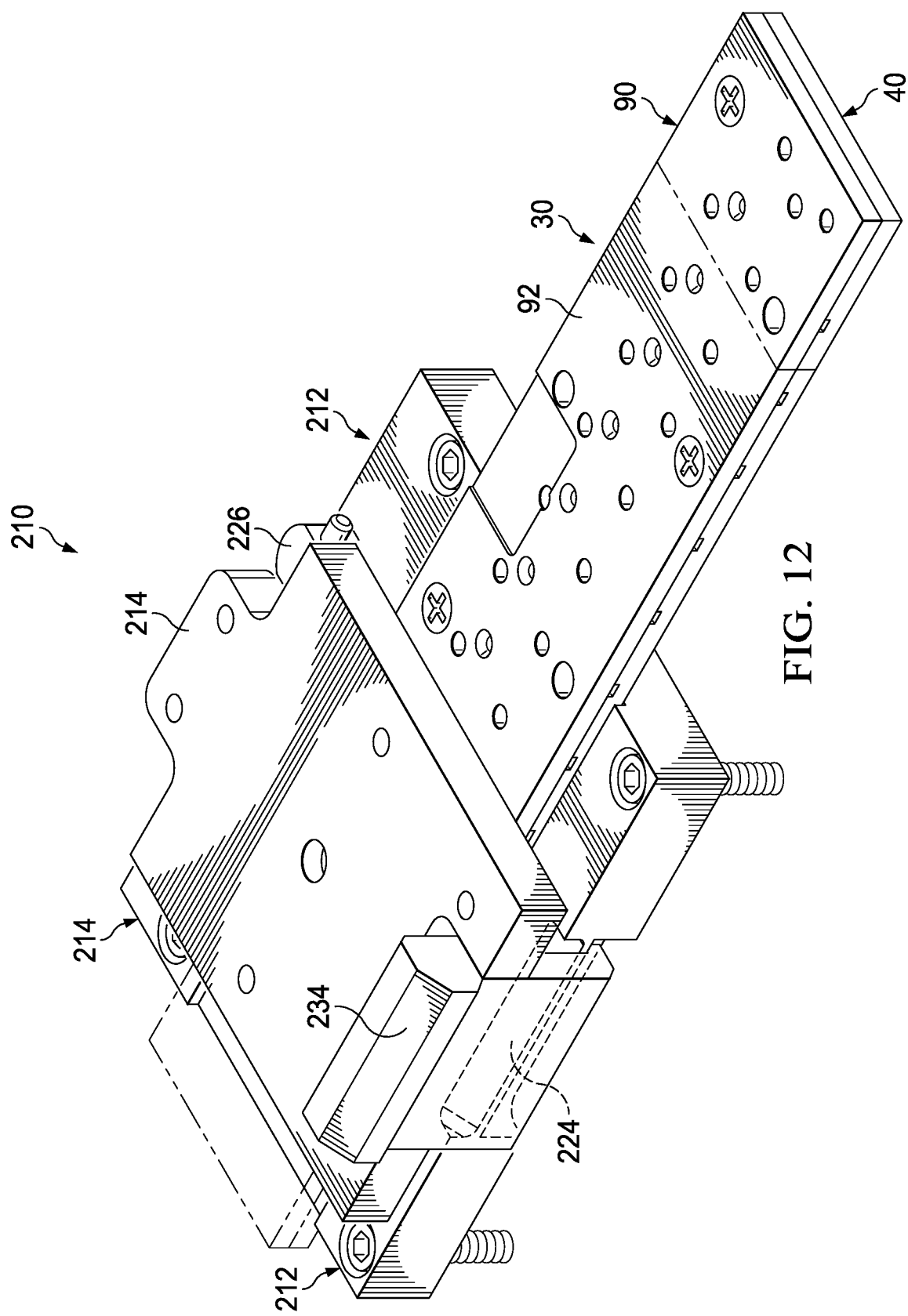
FIG. 12 is an isometric view of the ATE socket of FIG. 11 in a closed state with a carrier assembly operatively mounted therein.

FIGS. 11 and 12 illustrate an ATE socket assembly 210 adapted to receive and test DUTs in the carrier assembly 30. The ATE socket assembly 210 has a stationary portion 212 and a pivotally displaceable portion 214. The stationary portion 212 has an elongate recess 218 in an upper portion thereof. The elongate recess 218 comprises a flat surface 219 having upwardly projecting indexing pins 220, 222 extending therefrom. These indexing pins 220, 222 are received in indexing holes 62, FIG. 2, in the lower plate 40 of the carrier assembly 30.

As best illustrated in FIG. 11, the stationary portion 212 has a catch 224 formed thereon. A pivot assembly 226 pivotally attaches the stationary portion 212 to the displaceable portion 214. The pivotally displaceable portion 214 has a main body 228 that has a compressible resilient plate 232 mounted thereon. The compressible plate 232 is adapted to engage an upper surface 92 of the carrier assembly 30 to hold it in stationary relationship with the ATE socket assembly 210. A deflectable latch member 234 mounted on the displaceable portion 214 is adapted to cooperate with the catch portion 224 formed on the stationary portion 212.

In operation, the pivotally displaceable portion 214 of the socket assembly 210 is moved to an open position and a carrier assembly 30 is mounted at a predetermined longitudinal position on the stationary portion 212 by placing indexing pins 220, 222 in selected indexing holes in the carrier assembly 30. These indexing pins 220, 222 may hold the carrier assembly 30 at 10 different registration positions with respect to the ATE socket assembly of the illustrated embodiment. Testing of a different DUT 70 is performed at each of these 10 different registration positions. One of the test positions is shown in solid lines in FIG. 12 and another test position is shown in phantom lines. Testing in the ATE socket assembly 210 is performed by a test program, which collects data for each device verifying its functionality and parametric performance.

Figure 13:
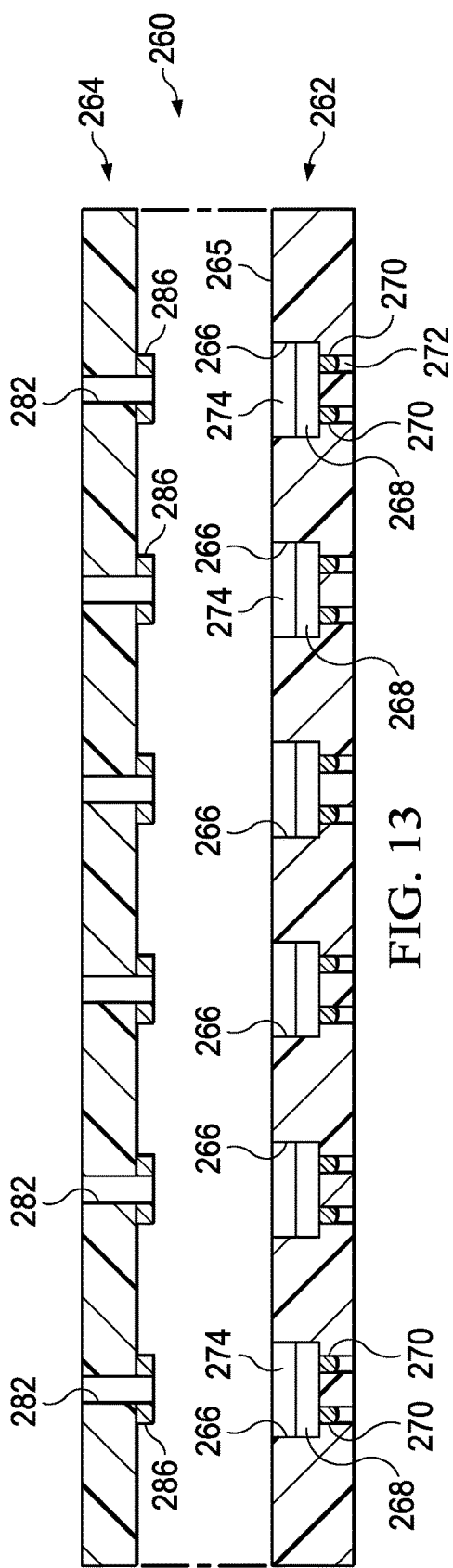
FIG. 13 is an exploded cross-sectional view of another embodiment of a carrier assembly.
Figure 14:
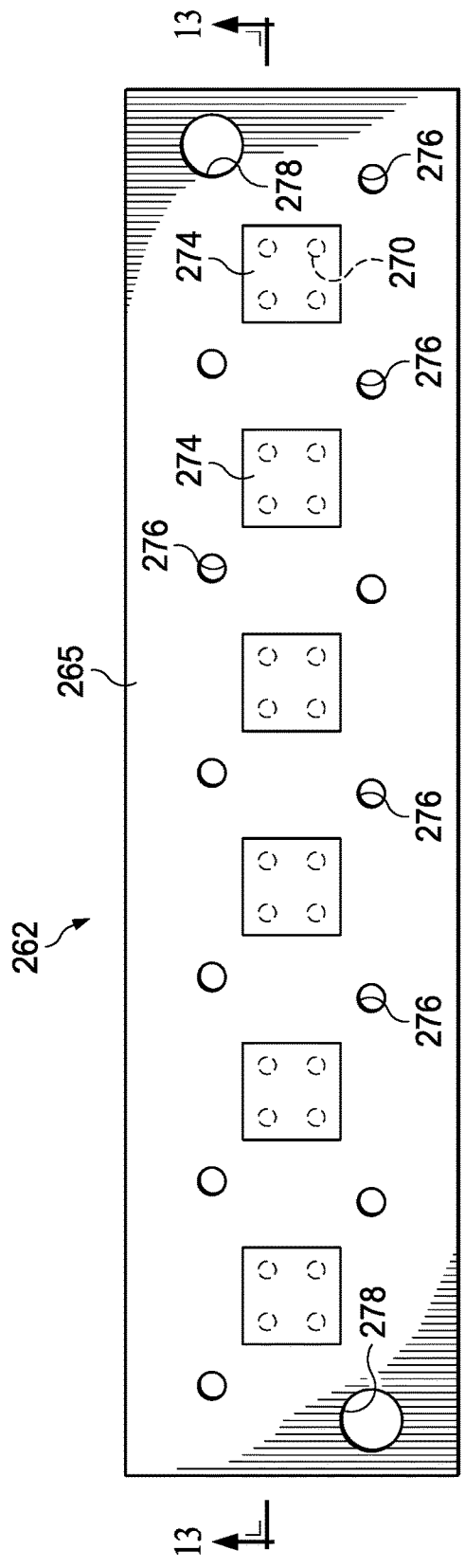
FIG. 14 is a top plan view of a bottom portion of the carrier assembly of FIG. 13.
Figure 15:
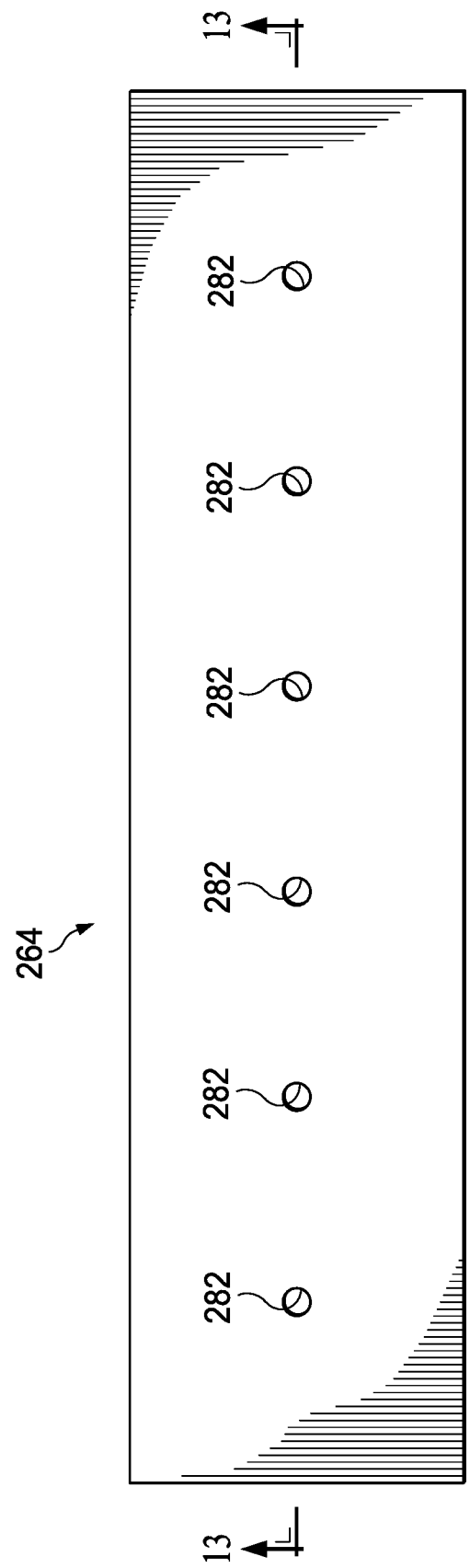
FIG. 15 is a top plan view of a top portion of the carrier assembly of FIG. 13.

FIG. 13 is an exploded cross-sectional elevation view of another embodiment of a carrier assembly 260. The carrier assembly 260 has a bottom plate 262 and a top plate 264. FIG. 14 is a top view of the bottom plate 262. FIG. 15 is a top view of the carrier assembly top plate 264. The bottom plate 262 has a top portion 265 having a number of pockets 266 formed therein. The pockets 266 are adapted to receive DUTs 268, each having four solder bumps 270. In this embodiment, the bottom plate 262 is adapted to receive six DUTs 268. A compressible pad 274 is positioned above each DUT 268. A spring pin receiving opening 272 is positioned beneath each solder bump 270 of each DUT, as best shown in FIG. 13. As best shown in FIG. 14, indexing (registration) holes 276, are provided in the bottom plate 262 on either side of the pockets 266 for indexing the carrier assembly 262 to an ATE socket. Air holes 282 are provided in the top plate 264 in alignment with each of the pockets 266 in the bottom plate 262. The top plate 264 has a fixed plunger structure 286 formed on a bottom surface thereof. The plunger structure 286 is positioned above each of the pockets 266. Plunger structure 286 is adapted to compressibly engage an associated compressible pad 274 that is positioned above each DUT 274, when the top plate 264 is attached to the bottom plate 262.

Figure 16:
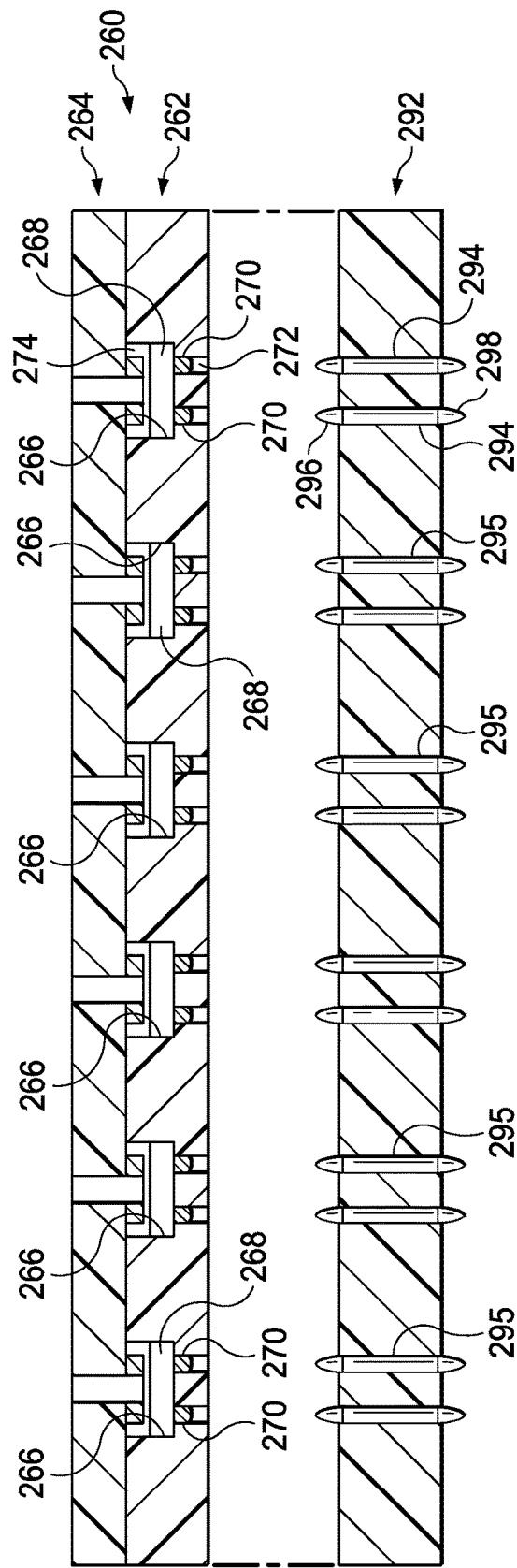
FIG. 16 is a cross-sectional side elevation view of the assembled carrier assembly of FIG. 13 positions above a socket assembly.

FIG. 16 is a cross-sectional side elevation view of the assembled carrier assembly 262 of FIGS. 13-15 mounted above a socket assembly 292. A plurality of spring pins 294 are mounted in spring pin holes 295 of the socket assembly 292. A top plunger portion 296 of each spring pin 294 is aligned with and adapted to engage a solder bump 270 positioned above it. A bottom plunger portion 297 of each spring pin is adapted to engage an associated portion of a test circuit board 312, FIG. 17, positioned below it.

Figure 17:
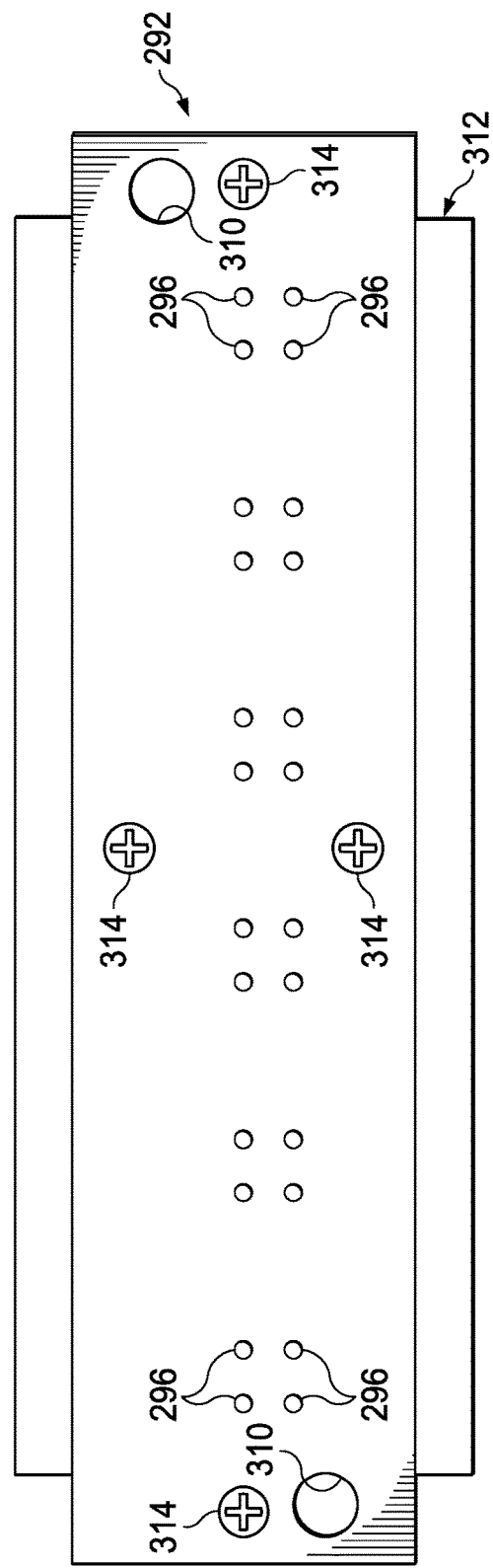
FIG. 17 is a top plan view of the socket assembly of FIG. 16 mounted on a test printed circuit board.

FIG. 17 is a top plan view of the socket assembly 292 of FIG. 16 mounted on a test circuit board 312. Registration holes 310 for registering the socket assembly with the carrier assembly 264 may be provided at two corner portions of the socket assembly 292, as shown in FIG. 17. FIG. 17 also illustrates the positions of plunger portions 296 of spring pins 294, shown in FIG. 16.

Figure 18:
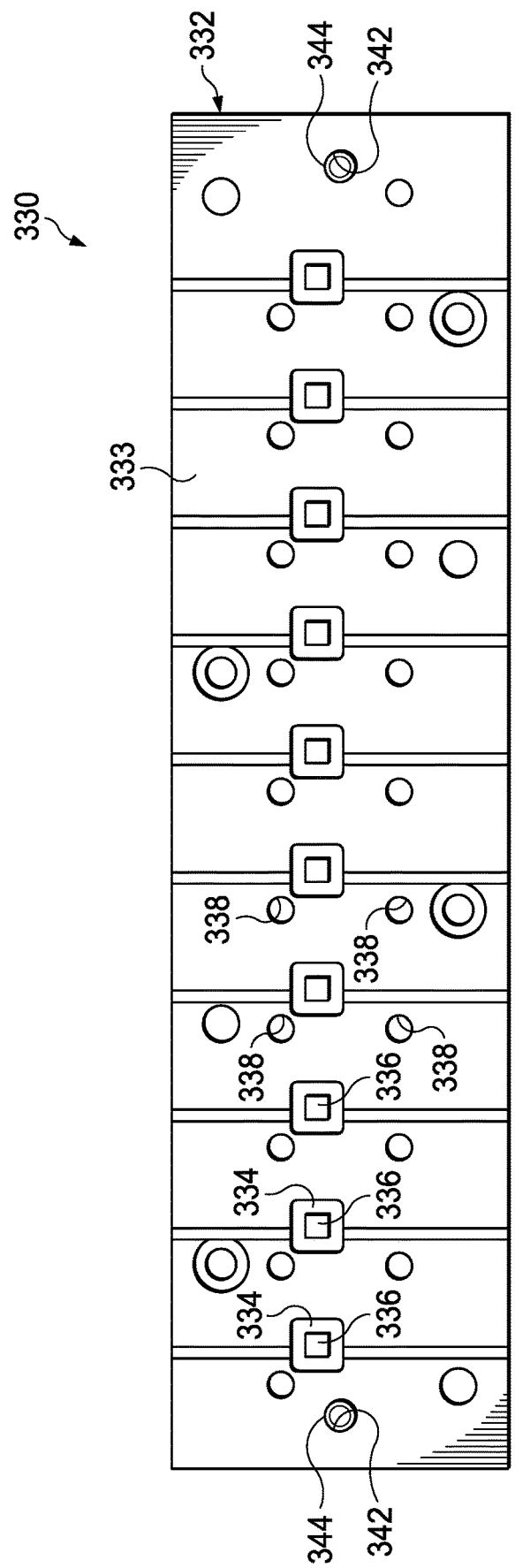
FIG. 18 is a top plan view of a bottom plate of another embodiment of a carrier assembly.
Figure 19:
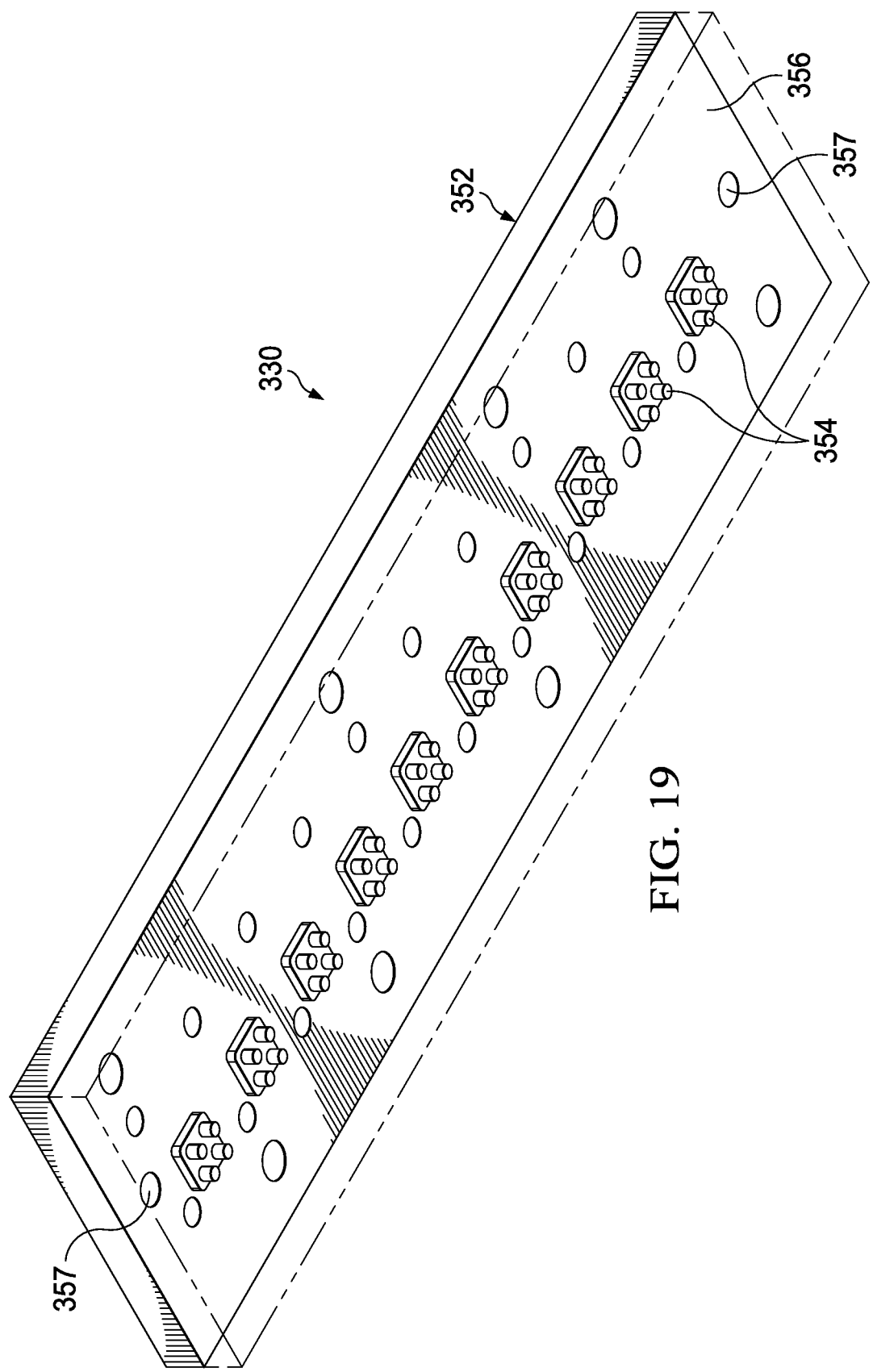
FIG. 19 is an isometric bottom view of a top plate of the carrier assembly of FIG. 18.

FIG. 18 is a top plan view of a bottom plate 332 of another carrier assembly 330. The bottom plate 332 has 10 DUT pockets 334 formed in an upper surface 333 thereof. A DUT 336 is mounted in each of the pockets 334. Indexing holes 338 for an ATE socket 210 are provided on either side of each pocket 334. A conditioning air vent channel 340 intersects each pocket 334. Holes 342 are positioned at either end of the bottom plate 332 for receiving alignment pins 344. FIG. 19 is a bottom isometric view of a top plate 352 of the carrier assembly 330. Plunger structures 354 extends downwardly from a bottom surface 356 of the top plate 352 at positions adapted to be aligned with pockets 334 of the bottom plate 332. Alignment pin holes 357 are provided at either end of the upper plate 352.

Figure 20:
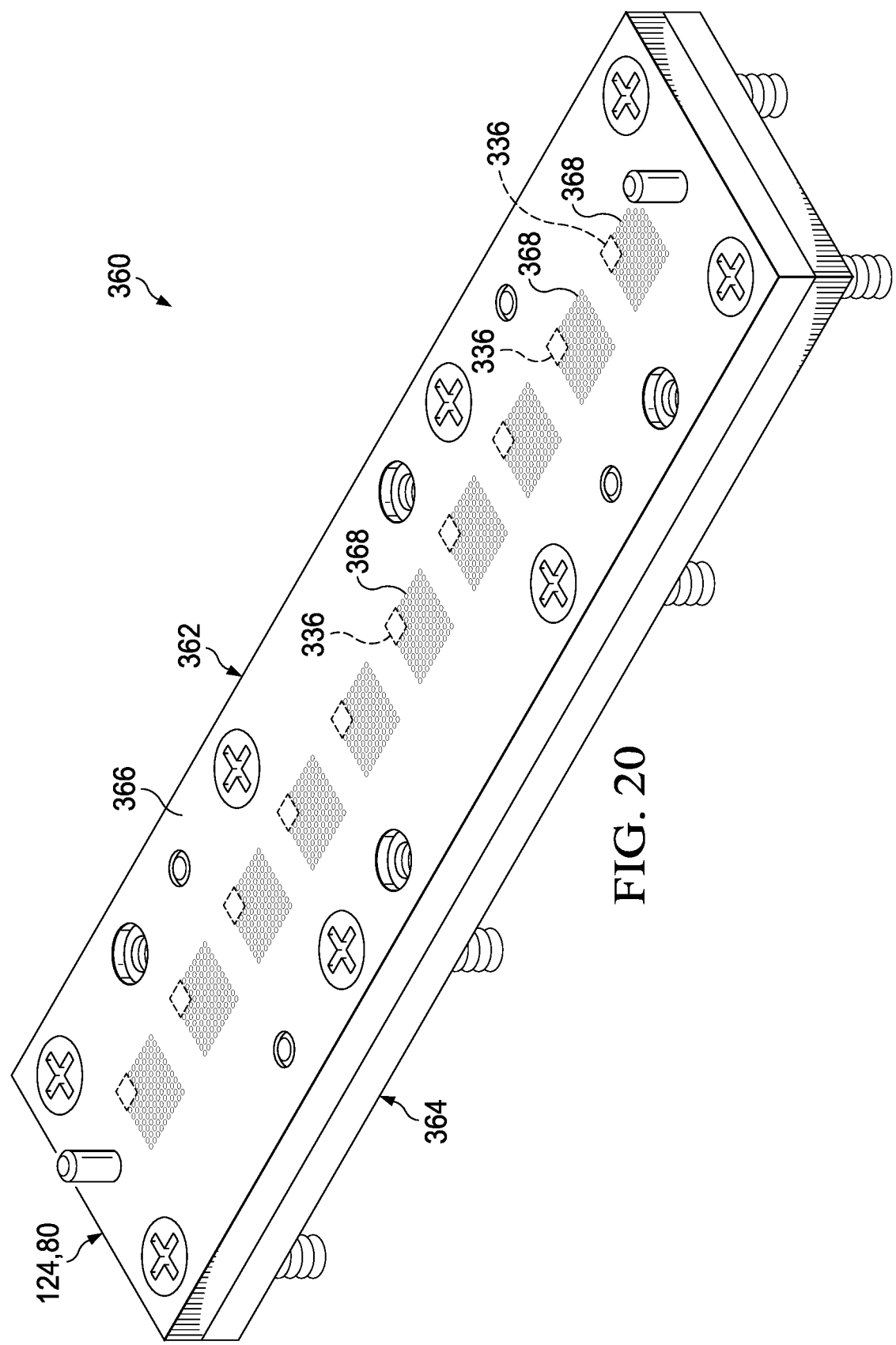
FIG. 20 is an isometric top view of a universal socket assembly, showing a projected position of the device under test shown in FIG. 18.

FIG. 20 is a top isometric view of a universal base socket assembly 360. The universal socket assembly includes a top plate 362 and a bottom plate 364. A top surface 366 of the top plate 362 has a plurality of spring pin arrays 368 arranged in linear alignment thereon. Each spring pin array 368 in the embodiment of FIG. 20 is a 10×10 spring pin array. The projected position of DUTs 336 mounted in an associate carrier assembly 330, shown in FIG. 18, are indicated in FIG. 20 by dashed line squares. The device under test 360 in FIG. 18 is a four bump flip chip. Its projection in FIG. 20 covers four pins in of the 100 pin array. Each spring pin array 368 is adapted to operably receive a DUT of any number of solder bumps from 1 bump to 100 bumps. Each carrier assembly used in association with the universal socket assembly 360 must have the pockets thereof appropriately positioned so that the DUT contained therein will be positioned above the appropriate pins of the associated spring pin array 368.

Figure 21:
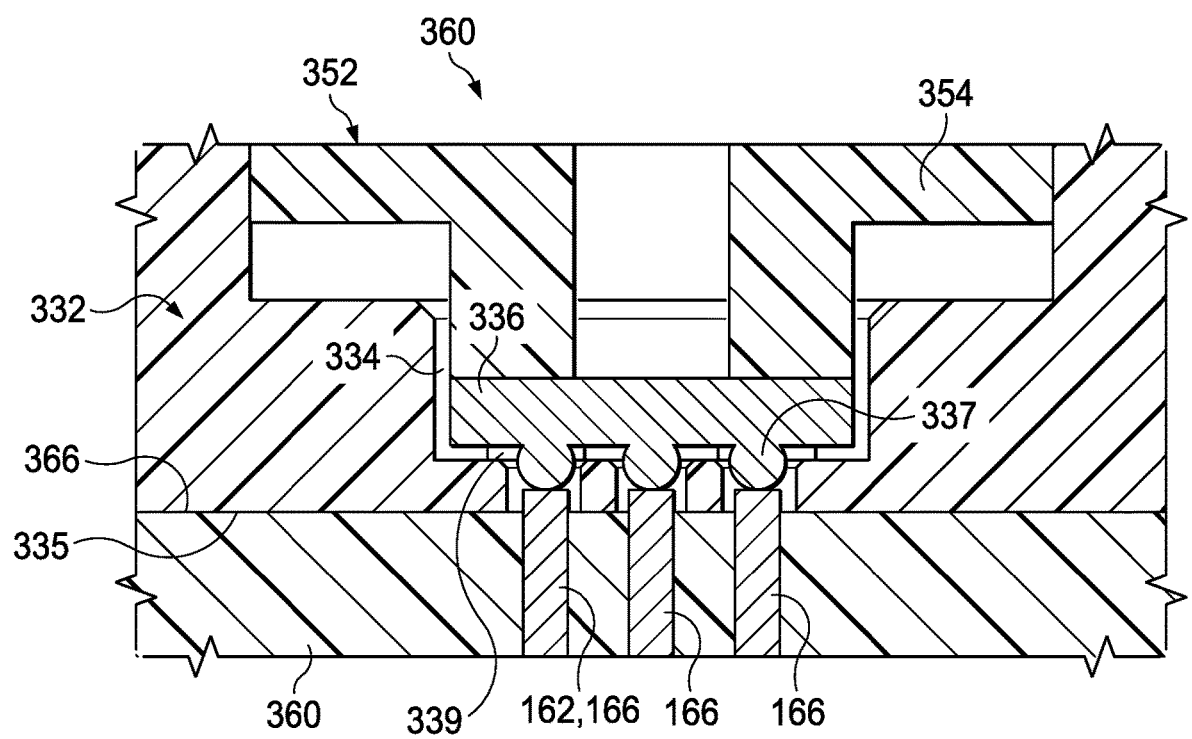
FIG. 21 is a detail cross-sectional view of a pocket region of the carrier assembly, shown in FIGS. 18 and 19.

FIG. 21 is a detail cross-sectional view of a DUT pocket 334 region of the carrier assembly 330, shown in FIGS. 18 and 19. The carrier assembly 330 is mounted on the universal socket assembly 360, shown in FIG. 20. The bottom plate 332 and top plate 352 of the carrier assembly 330 are engaged. A DUT 336 is mounted in the pocket 334. The DUT 336 has a plurality of solder bumps 337 extending downwardly from the DUT 336. In one embodiment the DUT 336 is supported on a nonconductive via-hole array 339 at the bottom of the pocket 334 through which the solder bumps 337 project. A top surface 366 of the socket assembly 364 is nonconductive in the region where plunger members 166 extend through it. This top surface 366 of the socket assembly engages the bottom surface 335 of the carrier assembly bottom plate 332.

Plunger structure 354 of the carrier top plate 352 extends into the pocket 334 and engages an upper surface of the DUT 336 urging the DUT against the via hole array 339. A spring pin 162 upper plunger member 166 is engaged with each of the DUT bumps 337 and is urged downwardly thereby into the compressed position shown in FIG. 21. Each spring pin 162 is also engaged with circuitry on a test board (not shown in FIG. 21) on which the socket assembly 360 is mounted. Thus, test signals are sent from the test hoard to the DUT's 336 through the spring pins 162.

Figure 22:
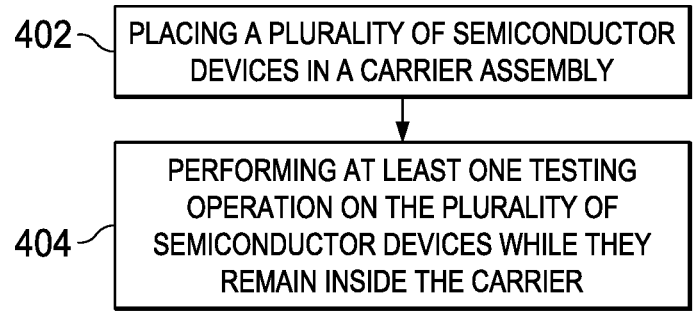
FIG. 22 is a flow diagram illustrating an example embodiment of a method of testing semiconductor devices.

FIG. 22 is a flow diagram illustrating an example embodiment of a method of testing semiconductor devices. The method includes, as shown at block 402, placing a plurality of semiconductor devices in a carrier assembly and also includes, as shown at block 404 performing at least one testing operation on the plurality of semiconductor devices while they remain inside the carrier.

Figure 23:
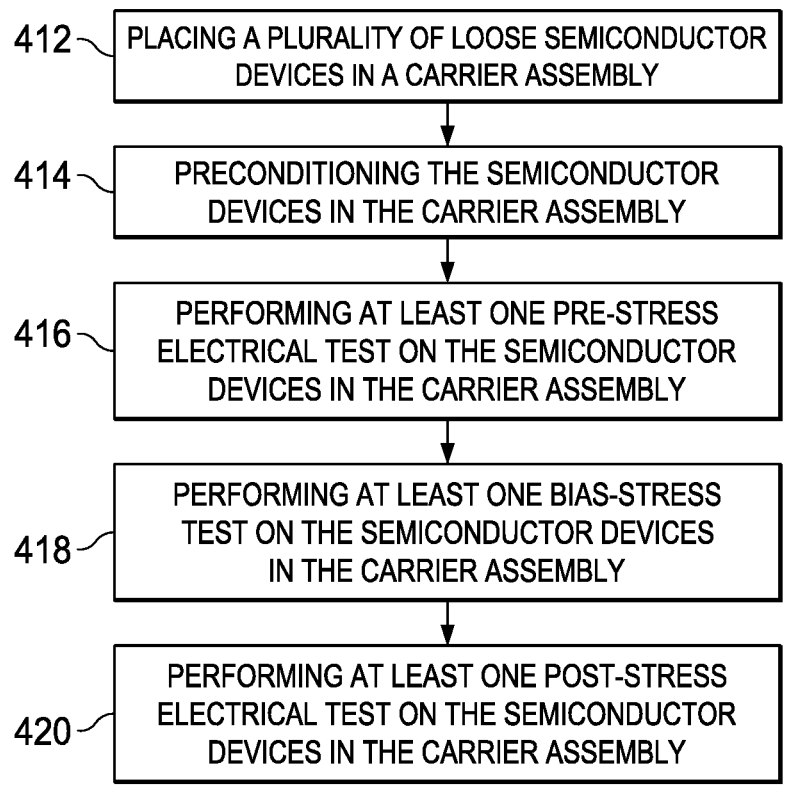
FIG. 23 is a flow diagram illustrating another example embodiment of a method of testing semiconductor devices.

FIG. 23 is a flow diagram illustrating an example embodiment of a method of testing semiconductor devices. The method includes, as shown at block 412, placing a plurality of loose semiconductor devices in a carrier assembly and, as shown at block 414, preconditioning the semiconductor devices in the carrier assembly. The method also includes, as shown at block 416, performing at least one pre-stress electrical test on the semiconductor devices in the carrier assembly and, as shown at block 418 performing at least one bias-stress test on the semiconductor devices in the carrier assembly. The method further includes as shown at block 420, performing at least one post-stress electrical test on the semiconductor devices in the carrier assembly.

Figure 24:
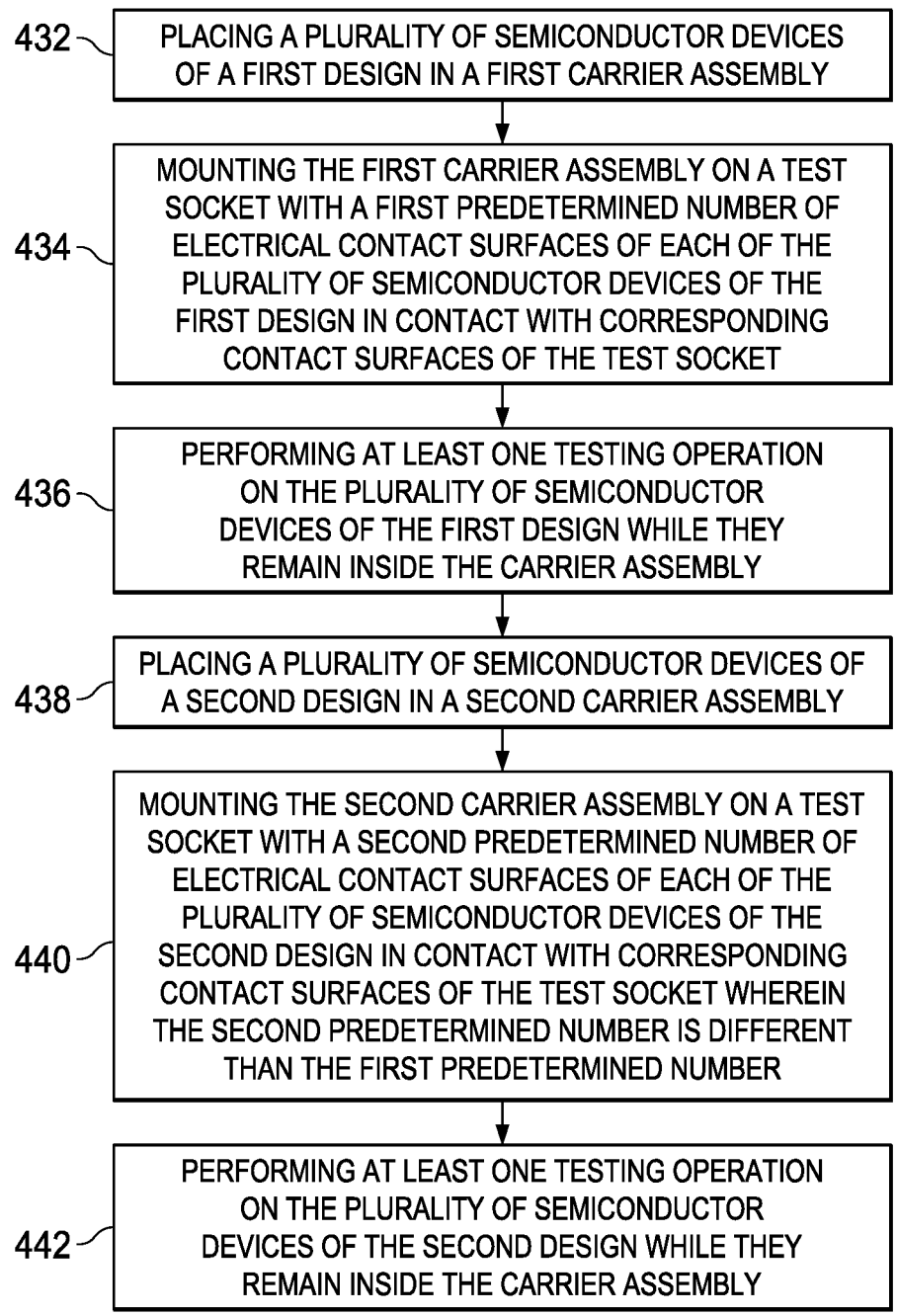
FIG. 24 is a flow diagram illustrating a further example embodiment of a method of testing semiconductor devices.

FIG. 24 is a flow diagram illustrating an example embodiment of a method of testing semiconductor devices that includes, as shown at block 432, placing a plurality of semiconductor devices of a first design in a first carrier assembly and, as shown at block 434, mounting the first carrier assembly on a test socket with a first predetermined number of electrical contact surfaces of each of the plurality of semiconductor devices of the first design in contact with corresponding contact surfaces of the test socket. The method also incudes, as shown at block 436, performing at least one testing operation on the plurality of semiconductor devices of the first design while they remain inside the carrier assembly. The method further includes, as shown at block 438, placing a plurality of semiconductor devices of a second design in a second carrier assembly and, as shown at block 440, mounting the second carrier assembly on a test socket with a second predetermined number of electrical contact surfaces of each of the plurality of semiconductor devices of the second design in contact with corresponding contact surfaces of the test socket wherein the second predetermined number is different than the first predetermined number. The method still further includes, as shown at block 442, performing at least one testing operation on the plurality of semiconductor devices of the second design while they remain inside the carrier assembly.

Some semiconductor testing method embodiments described herein may provide some or all of the following advantages over conventional semiconductor testing methods: shortened reliability test cycle times; complete elimination or minimization of semiconductor device handling during preconditioning; elimination of certain variables associated with board mounting and cleaning of semiconductor devices during testing; elimination of certain expenses associated with board mounting and cleaning of semiconductor devices during testing; elimination of the use and cost of carrier trays; enablement of batch process testing of semiconductor devices; reduction or elimination of invalid failures; simplification of the failure analysis process by elimination of die demounting and re-balling processes; and decreased parasitic inductance provided by decreasing the distance between active components on a biased reliability test board and semiconductor device contacts.

Although certain embodiments of a method of testing semiconductor devices have been expressly described in detail herein, alternative embodiments will occur to those skilled in the art after reading this disclosure. It is intended that the language of the appended claims be broadly construed to cover such alternative embodiments, except to the extent limited by the prior art.

What is claimed is:

1. A method of testing semiconductor devices comprising:
   placing a plurality of loose semiconductor devices in a carrier assembly;
   preconditioning the semiconductor devices in the carrier assembly;
   performing at least one pre-stress electrical test on the semiconductor devices in the carrier assembly;
   performing at least one bias-stress test on the semiconductor devices in the carrier assembly;
   performing at least one post-stress electrical test on the semiconductor devices in the carrier assembly.

2. The method of claim 1 further comprising unloading the semiconductor devices in the carrier assembly.

3. The method of claim 2 further comprising performing failure analysis on at least one semiconductor device unloaded from the carrier assembly.

4. The method of claim 1 wherein the placing the semiconductor devices in the carrier assembly comprises placing the semiconductor devices at predetermined locations in the carrier assembly.

5. The method of claim 4 wherein the predetermined locations each includes structures adapted to perform the at least one testing operation.

6. The method of claim 1 further comprising cleaning and drying the semiconductor devices while the devices remain inside the carrier assembly.

7. The method of claim 1 further comprising baking and cleaning the semiconductor devices while the devices remain inside the carrier assembly.

8. The method of claim 1 wherein the at least one testing operation includes a B-HAST test.

9. A method of testing semiconductor devices comprising:
   placing a plurality of loose semiconductor devices in a carrier assembly;
   performing at least one pre-stress electrical test on the semiconductor devices in the carrier assembly;
   performing at least one bias-stress test on the semiconductor devices in the carrier assembly;
   performing at least one post-stress electrical test on the semiconductor devices in the carrier assembly.

10. The method of claim 9 further comprising unloading the semiconductor devices in the carrier assembly.

11. The method of claim 10 further comprising performing failure analysis on at least one semiconductor device unloaded from the carrier assembly.

12. The method of claim 10 wherein the placing the semiconductor devices in the carrier assembly comprises placing the semiconductor devices at predetermined locations in the carrier assembly.

13. The method of claim 12 wherein the predetermined locations each includes structures adapted to perform the at least one testing operation.

14. The method of claim 10 further comprising cleaning and drying the semiconductor devices while the devices remain inside the carrier assembly.

15. The method of claim 10 further comprising baking and cleaning the semiconductor devices while the devices remain inside the carrier assembly.

16. The method of claim 10 wherein the at least one testing operation includes a B-HAST test.

17. An apparatus, comprising:
 means for placing a plurality of loose semiconductor devices in a carrier assembly;
 means for performing at least one pre-stress electrical test on the semiconductor devices in the carrier assembly;
 means for performing at least one bias-stress test on the semiconductor devices in the carrier assembly;
 means for performing at least one post-stress electrical test on the semiconductor devices in the carrier assembly.

18. The apparatus of claim 17 further comprising performing a failure analysis on at least one of the semiconductor devices.

19. The apparatus of claim 17 wherein the placing the semiconductor devices in the carrier assembly comprises placing the semiconductor devices at predetermined locations in the carrier assembly.

20. The apparatus of claim 19 wherein the predetermined locations each includes structures adapted to perform the at least one testing operation.

21. The apparatus of claim 17 wherein the at least one testing operation includes a B-HAST test.

* * * * *